United States Patent
Ogawa et al.

(10) Patent No.: US 9,508,571 B2
(45) Date of Patent: Nov. 29, 2016

(54) METHOD FOR CLEANING BASE, HEAT PROCESS METHOD FOR SEMICONDUCTOR WAFER, AND METHOD FOR MANUFACTURING SOLID-STATE IMAGE CAPTURING APPARATUS

(71) Applicant: CANON KABUSHIKI KAISHA, Tokyo (JP)

(72) Inventors: Toshiyuki Ogawa, Abiko (JP); Nobutaka Ukigaya, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/701,122

(22) Filed: Apr. 30, 2015

(65) Prior Publication Data

US 2015/0325456 A1 Nov. 12, 2015

(30) Foreign Application Priority Data

May 12, 2014 (JP) .................................. 2014-098887

(51) Int. Cl.
*H01L 21/77* (2006.01)
*H01L 21/02* (2006.01)
*H01L 21/67* (2006.01)
*H01L 21/687* (2006.01)
*B08B 7/00* (2006.01)

(52) U.S. Cl.
CPC ... *H01L 21/67109* (2013.01); *H01L 21/02054* (2013.01); *H01L 21/67051* (2013.01); *H01L 21/68757* (2013.01); *B08B 7/0071* (2013.01)

(58) Field of Classification Search
CPC .......... H01L 2224/29186; H01L 2224/80896; H01L 2924/10253; H01L 21/02255; H01L 21/02323; H01L 21/02332; H01L 21/02337; H01L 21/28185; H01L 21/28202; H01L 21/477; H01L 21/02054; B08B 7/0071
USPC .............................................. 438/795; 134/1
See application file for complete search history.

(56) References Cited

U.S. PATENT DOCUMENTS

| | | | |
|---|---|---|---|
| 2003/0124873 A1* | 7/2003 | Xing ...................... | C23C 16/402 438/770 |
| 2004/0185676 A1* | 9/2004 | Hasegawa ........... | H01L 21/0214 438/769 |
| 2005/0097941 A1* | 5/2005 | Sandvik ............. | G01N 27/4141 73/31.06 |
| 2007/0202673 A1* | 8/2007 | Kim ........................ | H01J 9/025 438/580 |
| 2013/0095597 A1* | 4/2013 | Park .................. | H01L 31/02363 438/72 |
| 2013/0203230 A1* | 8/2013 | Chen ................. | H01L 29/66477 438/287 |

FOREIGN PATENT DOCUMENTS

| | | |
|---|---|---|
| JP | 4-361527 A | 12/1992 |
| JP | 6-48837 A | 2/1994 |
| JP | 09082216 | * 3/1997 |

* cited by examiner

*Primary Examiner* — Caleen Sullivan
(74) *Attorney, Agent, or Firm* — Fitzpatrick, Cella, Harper & Scinto

(57) ABSTRACT

A method for cleaning a base for supporting an object to process in an apparatus configured to perform a heat process, the method comprising a first step of forming an oxide film on the base including silicon carbide, by subjecting the base to a heat process in a gas atmosphere including oxygen, and a second step of, after the first step, subjecting the base to a heat process in a gas atmosphere including steam, wherein the first step is performed for 10 hours at a temperature of 1000° C. or more.

11 Claims, 3 Drawing Sheets

METHOD FOR CLEANING BASE, HEAT PROCESS METHOD FOR SEMICONDUCTOR WAFER, AND METHOD FOR MANUFACTURING SOLID-STATE IMAGE CAPTURING APPARATUS

BACKGROUND OF THE INVENTION

Field of the Invention

The present invention relates to a method for cleaning a base, a heat process method for a semiconductor wafer, and a method for manufacturing a solid-state image capturing apparatus.

Description of the Related Art

A semiconductor manufacturing apparatus or processing apparatus (hereinafter referred to simply as a "processing apparatus" in the present specification) that performs a heat process for a semiconductor wafer or the like includes, in a chamber, a base for supporting an object to process. While the processing apparatus is being used, impurities such as Fe attach to the base, and there is a risk that the impurities will contaminate a semiconductor wafer when the wafer is subjected to a heat process. For this reason, processing for removing or reducing attached impurities (cleaning) is carried out on the base.

SUMMARY OF THE INVENTION

The present invention provides a technique that is advantageous for cleaning a base for supporting an object to process in an apparatus for subjecting a semiconductor wafer to a heat process.

One of the aspects of the present invention provides a method for cleaning a base for supporting an object to process in an apparatus configured to perform a heat process, the method comprising a first step of forming an oxide film on the base including silicon carbide, by subjecting the base to a heat process in a gas atmosphere including oxygen, and a second step of, after the first step, subjecting the base to a heat process in a gas atmosphere including steam, wherein the first step is performed for 10 hours at a temperature of 1000° C. or more.

Further features of the present invention will become apparent from the following description of exemplary embodiments with reference to the attached drawings.

DESCRIPTION OF THE EMBODIMENTS

First Embodiment

Figure 1:
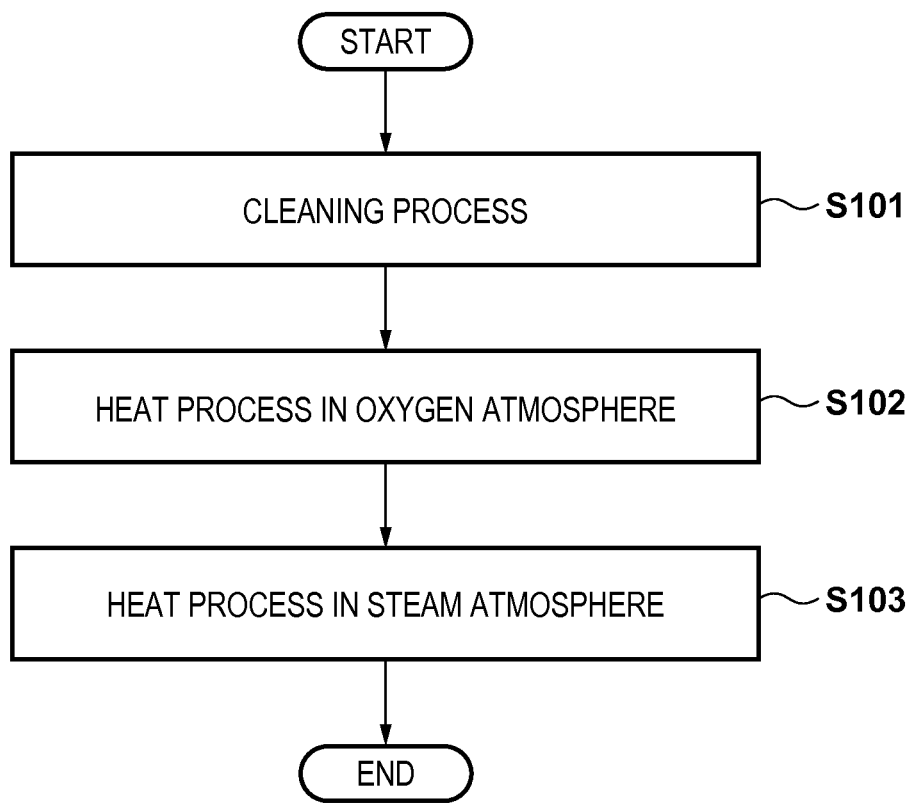
FIG. 1 is a diagram illustrating a flowchart for an example of a base processing method.

FIG. 1 is a flowchart for describing an example of a cleaning method for a base ST according to a first embodiment. The cleaning method according to the present embodiment includes the processes of steps S101 to S103. Note that step S101 and the like will be referred to simply as "S101" and the like below.

Figure 2A:
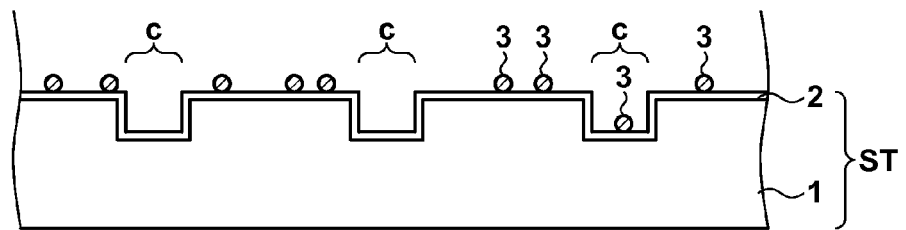
FIGS. 2A to 2D are diagrams illustrating an example of a base processing method.
Figure 2B:
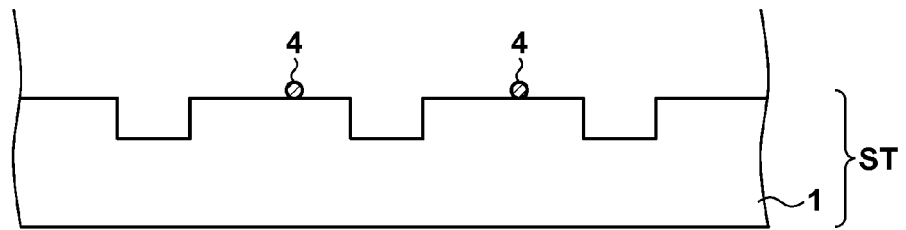
Figure 2C:
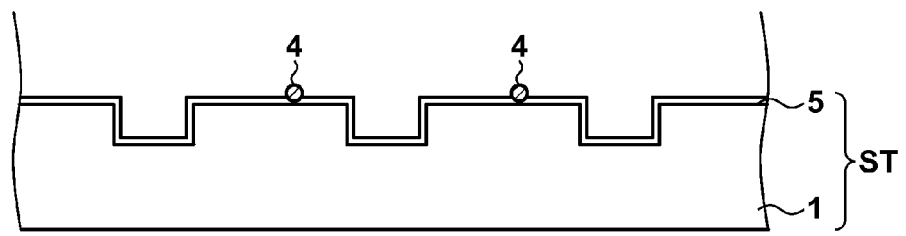
Figure 2D:
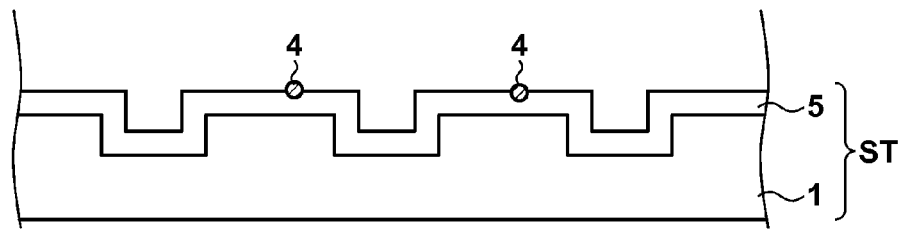

FIGS. 2A to 2D are schematic diagrams for describing the mode of the base ST in each step of the cleaning method. FIG. 2A shows the state of the base ST before S101. FIG. 2B shows the state of the base ST after S101 and before S102. FIG. 2C shows the state of the base ST after S102 and before S103. FIG. 2D shows the state of the base ST after S103.

As illustrated in FIG. 2A, on its upper surface, the base ST has recessed portions c that prevent a semiconductor wafer from adhering to the upper surface of base ST due to a heat process in the processing apparatus. The base ST has a base member 1. The base member 1 has sufficient heat resistance for sufficiently withstanding the heat process carried out by the processing apparatus, and the base member 1 can mainly be constituted by silicon carbide. Also, an oxide film 2 is formed on the surface of the base member 1, and impurities 3 such as Fe for example are attached to the surface of the oxide film 2. Note that the oxide film 2 may be formed while the processing apparatus is used, or it may be formed before the processing apparatus is used.

In S101, a cleaning process is performed on the base ST. Specifically, for example, a cleaning process is performed for 10 minutes using a cleaning liquid such as hydrofluoric acid (25 wt %). Accordingly, as shown in FIG. 2B, the oxide film 2 is removed and the impurities 3 are removed. At this time, a portion of the impurities 3 or residue of the cleaning liquid become attached as impurities 4 in some cases.

In S102, the base ST is installed in the chamber of a predetermined heat process apparatus, and the base ST is subjected to the heat process in a gas atmosphere including oxygen ($O_2$). Hereinafter, the heat process of S102 will be referred to as "oxygen heat process" in the present specification.

It is preferable that the oxygen heat process is carried out at, for example, a temperature of 1000° C. or more, an oxygen flow amount of 10 slm or more, and a process time of 10 hours or more. By performing the oxygen heat process under a high temperature condition at a temperature of 1000° C. or more, a thermal oxide film 5 can be formed in a short time. Here, an oxygen heat process was performed at a temperature of 1100° C., an oxygen flow amount of 10 slm, and a processing time of 20 hours.

With the present step, the thermal oxide film 5 is formed on the surface of the base member 1 as shown in FIG. 2C. Note that the oxygen heat process may be carried out in a mixed gas atmosphere including oxygen, which may further include nitrogen, for example. Note that the mixed gas in the heat process does not include steam.

In S103, the base ST is installed in the chamber of a predetermined heat process apparatus (may be the same as that used in S102, or may be an apparatus different from that used in S102), and the base ST is subjected to the heat process in a gas atmosphere including steam ($H_2O$). Hereinafter, the heat process of S103 will be referred to as "steam heat process" in the present specification.

It is preferable that the steam heat process is carried out at a temperature of 1000° C. or more, a steam flow amount of 5 slm or more, and a process time of 10 hours or more. By performing the steam heat process under a high temperature condition at a temperature of 1000° C. or more, the thermal oxide film 5 can be thickened in a short time. Here, a steam heat process was performed at a temperature of 1100° C., a steam flow amount of 5 slm, and a processing time of 20 hours.

According to the present step, as shown in FIG. 2D, the thermal oxide film 5 can be thickened further. Note that the steam heat process may be carried out in a mixed gas atmosphere including steam, which may furthermore include oxygen and nitrogen.

Figure 3:
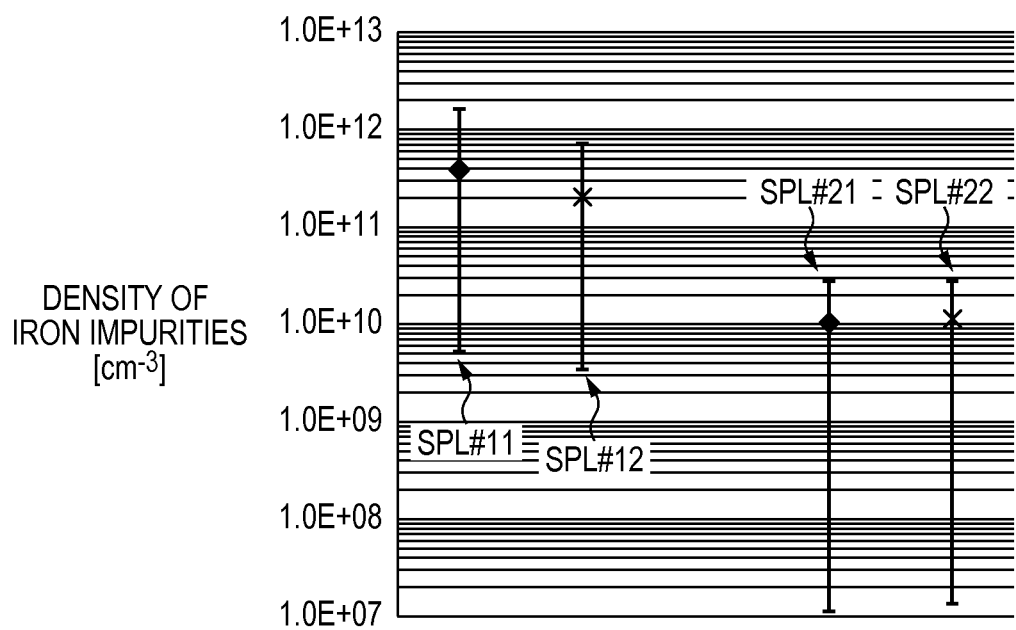
FIG. 3 is a diagram illustrating an example of experimental results.

FIG. 3 shows experimental results for describing an effect of the cleaning method according to the present embodiment. In this experiment, a base in a state after steps S101 to S102 and before step S103 ("base ST1") and a base in the state after steps S101 to S103 ("base ST2") are prepared. Then, the bases ST1 and ST2 are separately installed in the processing apparatus, and the semiconductor wafer heat process is performed twice on each using the processing apparatus. Let samples SPL #11 to 12 be two semiconductor wafers obtained from the processing apparatus in which the base ST1 was installed. Let samples SPL #21 to 22 be two semiconductor wafers obtained from the processing apparatus in which the base ST2 was installed. The Fe impurity density detected in the samples SPL #11 to 12 was $2 \times 10^{11}$ to $4 \times 10^{11}$ cm$^{-3}$. In contrast, the Fe impurity density detected in the samples SPL #21 to 22 was about $1 \times 10^{10}$ cm$^{-3}$, which was lower than that of the samples SPL #11 to 12.

Also, in the present embodiment, the steam heat process (S103) is performed. That is to say, in the present embodiment, after the oxide film 5 is formed using the oxygen heat process, the steam heat process is used to grow the oxide film 5 in order to increase the film thickness of the oxide film 5. Since the oxide film 5 formed by the oxygen heat process has little variation in film thickness and has a dense crystal structure, according to the present embodiment, the oxide film 5 and a portion of the surface thereof are difficult to separate. This is advantageous since stress that occurs due to the oxide film 5 being formed is reduced in the case of the structure in which the base ST has the recessed portions c on its surface as illustrated in FIG. 2 in particular. Note that although a structure having recessed portions c has been given as an example here, the same follows for a structure having openings or grooves with a predetermined shape, or a structure having through holes that pass through to the rear surface side as well. Therefore, according to the present embodiment, it is possible to prevent separation and scattering of the oxide film 5 in the case where the cleaned base ST is installed in a processing apparatus and the processing apparatus is run once again.

Note that in the oxygen heat process (S102), it is possible to form a thermal oxide film 5 with superior density and film thickness uniformity. By performing this kind of process before the steam heat process, variation in the film thickness of the oxide film resulting from the steam heat process is reduced, and it is possible to obtain a good quality oxide film. This kind of process makes it possible to obtain a greater effect of reducing contamination.

According to the above description, upon using the base ST that was cleaned in the present embodiment, contamination of a semiconductor wafer due to impurities is reduced, which is advantageous for improving yield. It is also advantageous for obtaining greater product quality for a semiconductor apparatus obtained from the wafer, and for example, in the case of forming a sensor chip (solid-state image capturing apparatus) such as a CMOS image sensor, it is advantageous for improving the sensor capability.

Second Embodiment

Figure 4:
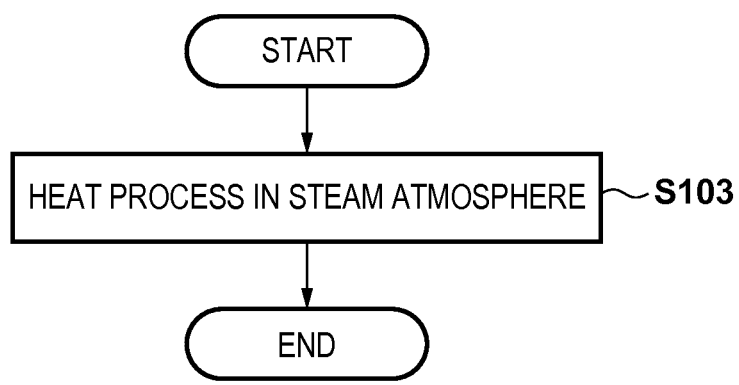
FIG. 4 is a diagram illustrating a flowchart for an example of a base processing method.

A second embodiment will be described with reference to FIG. 4. The present embodiment mainly differs from the first embodiment in that only the steam heat process (S103) is performed. That is to say, in the case where simple cleaning of the base ST is to be performed for some reason, the cleaning process of S101 and the oxygen heat process of S102 may be omitted. Examples of reasons for doing this include there being relatively few impurities 3 attached to base ST, an oxide film 2 having been formed in advance on the base ST, and the like.

It is preferable to use the oxide film described in the first embodiment as the oxide film 2. In this case, since the oxide film 2 has little variation in film thickness and has a dense crystal structure, the oxide film 2 and a portion of the surface thereof are difficult to separate. Also, similarly to the first embodiment, the base ST is cleaned by performing the steam heat process.

According to the present embodiment as well, in addition to obtaining an effect similar to that of the first embodiment, it is possible to shorten the downtime of the processing apparatus since the cleaning period of the base ST is shortened.

Other Embodiments

The cleaning in the first and second embodiments may, for example, be carried out at a predetermined period, such as every half-year, and may be carried out in the case where the result of a periodically-performed examination of the processing apparatus does not satisfy predetermined criteria. For example, the examination may be performed about every six to twelve months. Also, if the processing apparatus is repaired or the like, it is desirable to perform this cleaning after repairs since there is a risk that, in addition to metal such as Fe, impurities such as organic material will attach to the base.

Furthermore, the cleaning in the first and second embodiments was performed on the base ST, but it may be performed on another member of the apparatus that performs the heat process. In particular, it is desirable that it is performed on a member that comes in contact with a semiconductor wafer.

Also, the heat process carried out on the base ST in the first and second embodiments may be performed after the base is installed in the apparatus that performs the heat process on the semiconductor apparatus, and it may be performed using another apparatus that performs the heat process. By performing the heat process using an apparatus that performs the heat process on the semiconductor apparatus, it is possible to perform cleaning on the impurities 3 that become attached when the base ST is installed, and it is possible to further reduce contamination. Furthermore, since similar processing can be performed on a member other than the base ST of the apparatus that performs the heat process as well, it is possible to further reduce contamination. On the other hand, by performing the heat process using another apparatus that performs the heat process, cleaning can be performed without receiving any restrictions, such as those regarding the temperature condition and gas flow amount of the apparatus that is to perform the heat process on the semiconductor apparatus, and cleaning can be performed in more effective conditions. Note that the cleaning process in which cleaning liquid is used is performed before the installation of the base ST.

Two preferred embodiments have been illustrated above as examples, but the present invention is not limited thereto, and according to the object and the like, modifications to portions thereof and combinations of portions of the above-described embodiments are also possible.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-098887, filed May 12, 2014, which is hereby incorporated by reference herein in its entirety.

What is claimed is:

1. A method for cleaning a base for supporting a semiconductor wafer in a chamber of a processing apparatus, the processing apparatus configured to perform a heat process on the semiconductor wafer, the method comprising:
    preparing the base constituted by material including silicon carbide;
    cleaning the base using a cleaning liquid;
    performing a first heat process on the base in a gas atmosphere including oxygen so as to form an oxide film on a surface of the base; and
    performing a second heat process, after the performing of the first heat process, on the base in a gas atmosphere including steam so as to thicken the oxide film,
    wherein the first heat process is performed for 10 hours or more at a temperature of 1000° C. or more,
    whereby an Fe impurity density of the semiconductor wafer in a case of performing a heat process using the base obtained after the performing of the second heat process is lower than an Fe impurity density of the semiconductor wafer in a case of performing a heat process using the base obtained after the performing of the first heat process and before the performing of the second heat process.

2. The method according to claim 1, wherein the second heat process is performed at a temperature of 1000° C. or more.

3. The method according to claim 1, wherein the second heat process is performed under a condition such that a flow amount of the steam is 5 slm or more and a heat process time is 10 hours or more.

4. The method according to claim 1, wherein the first heat process is performed under a condition such that a flow amount of the oxygen is 10 slm or more.

5. The method according to claim 1, further comprising installing the base in a chamber of an apparatus for performing the first and second processes, before the performing of the first process and the performing of the second process.

6. The method according to claim 1, wherein hydrofluoric acid is used as the cleaning liquid in the cleaning the base.

7. The method according to claim 1, wherein:
    after the cleaning of the base and before the performing of the first heat process, an impurity is attached on the surface of the base;
    after the performing of the first heat process and before the performing of the second heat process, part of the impurity is buried in the oxide film; and
    after the performing of the second heat process, the impurity is buried in the oxide film deeper than after the performing of the first heat process and before the performing of the second heat process.

8. The method according to claim 1, further comprising installing the base in the chamber of the processing apparatus, after the performing of the second heat process.

9. The method according to claim 8, wherein the semiconductor wafer is in contact with the base installed in the chamber of the processing apparatus, in performing the heat process on the semiconductor wafer by the processing apparatus.

10. A heat process method for a semiconductor wafer, the method comprising:
    cleaning the base using the method according to claim 1;
    placing the semiconductor wafer on the base; and
    performing the heat process on the semiconductor wafer.

11. A method for manufacturing a solid-state image capturing apparatus, the method comprising:
    performing the heat process for the semiconductor wafer using the method according to claim 9; and
    forming a photoelectric conversion element on the semiconductor wafer.

* * * * *